United States Patent [19]
Chow

[11] Patent Number: 5,781,026
[45] Date of Patent: Jul. 14, 1998

[54] CMOS LEVEL SHIFTER WITH STEADY-STATE AND TRANSIENT DRIVERS

[75] Inventor: Hwang-Cherng Chow, Hsinchu, Taiwan

[73] Assignee: Industrial Technology Research Institute, Hsinchu, Taiwan

[21] Appl. No.: 623,310

[22] Filed: Mar. 28, 1996

[51] Int. Cl.$^6$ .............................................. H03K 19/0185
[52] U.S. Cl. ................................ 326/26; 326/27; 326/68; 326/98
[58] Field of Search ................... 326/21, 26–27, 326/63, 68, 81–82, 93, 98

[56] References Cited

U.S. PATENT DOCUMENTS

| | | | |
|---|---|---|---|
| 4,504,747 | 3/1985 | Smith et al. | 326/63 X |
| 4,948,991 | 8/1990 | Schucker et al. | 326/26 X |
| 5,239,237 | 8/1993 | Tran et al. | 365/189.05 |

*Primary Examiner*—David R. Hudspeth
*Attorney, Agent, or Firm*—Meltzer, Lippe, Goldstein, Wolf & Schlissel, P.C.

[57] ABSTRACT

A level shifter is provided with first and second steady-state drivers and transient driver circuitry. Each steady-state driver includes a low enable input, a high enable input and an output. Each steady-state driver outputs from its respective output a low voltage level signal when an enabling voltage level is received at its low enable input and a disabling voltage is received at its high enable input. Furthermore, each steady-state driver outputs from its output a first high voltage level signal, that is higher than a second high voltage level of an input signal, when a disabling voltage level is received at its low enable input and an enabling high voltage level is received at its high enabling input. The high enable input of the first steady-state driver is connected to the output of the second steady-state driver. The high enable input of the second steady-state driver is connected to the output of the first steady-state driver. The input of the first steady-state driver receives a complement of the input signal and the input of the second steady-state driver receives the input signal. The transient driver circuitry responds to a transition in the voltage level of the input signal by driving the output of one of the first and second drivers, to the first high voltage level, for a certain time period. The transient driver circuitry is enabled to drive the output with a maximum driving capacity throughout the aforementioned certain time period.

8 Claims, 9 Drawing Sheets

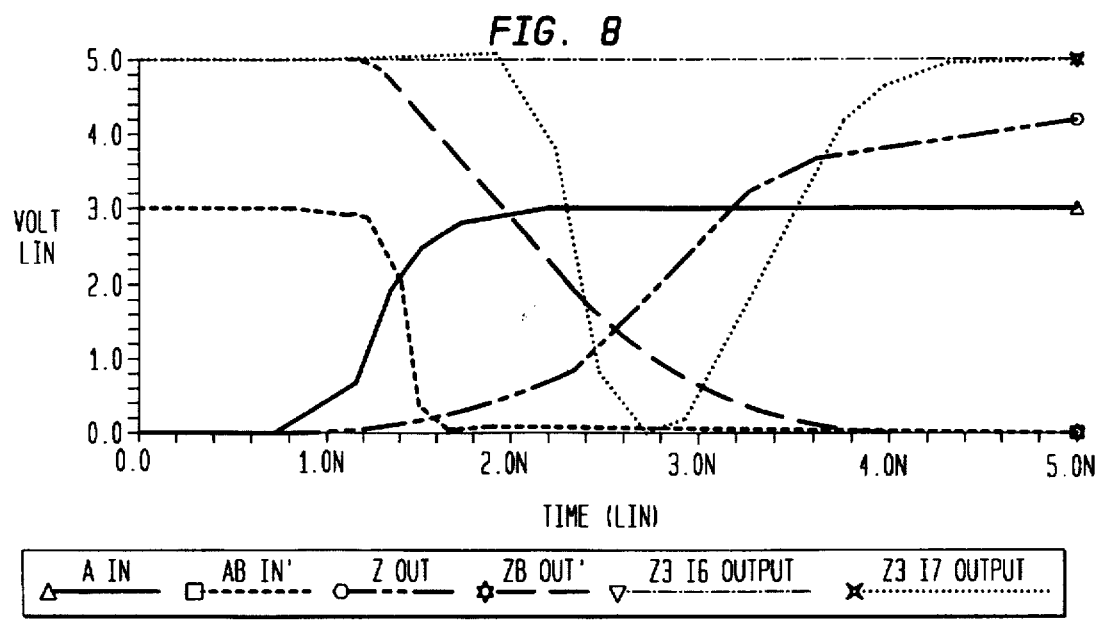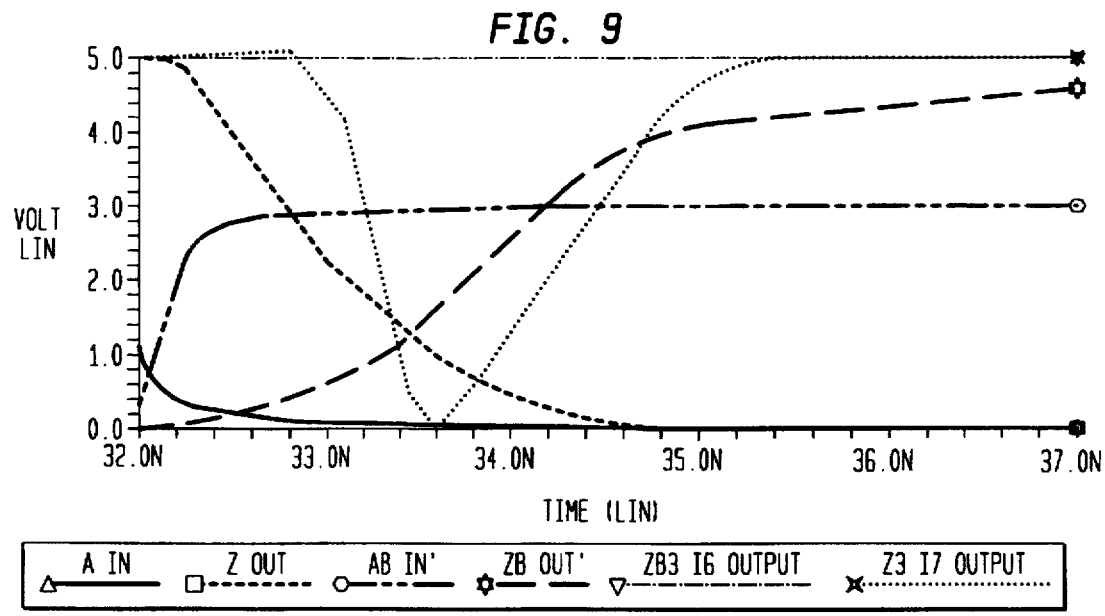

5,781,026

1

CMOS LEVEL SHIFTER WITH STEADY-STATE AND TRANSIENT DRIVERS

RELATED APPLICATION

The subject matter of this application is related to the subject matter of the following patents and patent applications:

(1) U.S. patent application Ser. No. 08/623,351, entitled "CMOS Level Shifter," filed on even date herewith for Hwang-Cherng Chow, (2) U.S. patent application Ser. No. 08/623,350, entitled "CMOS Bidirectional Buffer Circuit Without Enable Control Signal," filed on even date herewith for Hwang-Cherng Chow, and (3) U.S. patent application Ser. No. 08/623,583, entitled "CMOS Output Buffer with Reduced L di/dt Noise," filed on even date herewith for Hwang-Cherng Chow.

All of the above-listed patents and patent applications are commonly assigned to the assignee of this application and are incorporated herein by reference.

FIELD OF THE INVENTION

The present invention relates to integrated circuits (ICs), such as, metal oxide semiconductor (MOS) ICs, employing multiple voltage levels to represent a binary logic value. The present invention is directed to voltage level "interfaces" or level shifters in such circuits. In particular, the present invention is directed to speeding up the transient response of level shifters when the inputted signal transition between two voltage levels, i.e., transitions its logic value.

BACKGROUND OF THE INVENTION

In MOS ICs, MOS devices, such as MOSFETs, are employed which are biased with a high voltage and a low voltage. The low voltage is commonly referred to as $V_{SS}$ and is often 0 volts (ground). The high voltage is commonly referred to as $V_{DD}$ and is often 5 Volts. However, in some low voltage MOS ICs, the high voltage may be less than 5 volts, for example 3 volts. Usually, the low voltage $V_{SS}$ corresponds to a logic '0' value and the higher voltage $V_{DD}$ corresponds to a logic '1' value.

Some MOS ICs must accommodate multiple "high" voltage levels. For sake of convenience, the "larger" high voltage (corresponding to logic value '1') is referred to herein as $V_{DD}$ and the "smaller" high voltage (also corresponding to logic value '1') is referred to as $V_{CC}$. For example, the integrated circuit may have some internal circuitry which uses the $V_{CC}$ voltage level for the logic value '1' and other circuitry which uses the $V_{DD}$ voltage level for the logic value '1'. Alternatively, the internal circuitry uses $V_{CC}$ and converts to-be-outputted output signals (i.e., that are outputted to external devices) to $V_{DD}$. FIG. 1 shows a conventional level shifter 10 for converting an input signal that has low $V_{SS}$ and "small" high $V_{CC}$ voltage levels to an output signal with low $V_{SS}$ and "larger" high $V_{DD}$ voltage levels. As shown, the level shifter 10 includes an inverter 20, a first level shifting inverter 30 and a second level shifting inverter 40. The first level shifting inverter 30 is formed from NMOS transistor N1 and PMOS transistor P1. The second level shifting inverter 40 is formed from NMOS transistor N2 and PMOS transistor P2. Each level shifting inverter 30 or 40 has an output node OUT' or OUT which is connected to a common drain connection of the transistors N1 and P1 or the transistors N2 and P2. The gate of the PMOS transistor P1 or P2 in either inverter 30 or 40 is

2 cross-coupled to the output node OUT or OUT' of the other inverter 40 or 30 (the gate of transistor P1 is connected to node OUT and the gate of transistor P2 is connected to node OUT'). The sources of the transistors P1 and P2 are connected to the large high voltage $V_{DD}$ power supply bus and the source of the transistors N1 and N2 are connected to the $V_{SS}$ power supply bus. The gate of the transistor N1 is connected to the node IN. An inputted signal is applied to the node IN. The inputted signal applied to the node IN is fed to the inverter 20 which outputs the complement of the inputted signal to a node IN'. (Note that the inverter 20 is biased with the small high voltage $V_{CC}$ and the low voltage $V_{SS}$. This is because the voltage levels of the input signal fall in the range of $V_{SS}$–$V_{CC}$). The complement of the input signal applied to the node IN' is fed to the gate of the transistor N2.

In this configuration, the inverter 30 outputs from the output node OUT' the "level shifted" complement of the input signal and the inverter 40 outputs from the output node OUT the "level shifted" input signal. More particularly, consider the steady-state case where the input signal applied to the node IN is a logic '0' with low voltage level $V_{SS}$. The inverter 20 outputs the complement of the input signal with logic value '1' and small high voltage level $V_{CC}$ to the node IN'. The small high voltage level $V_{CC}$ of the node IN' is applied to the gate of the transistor N2 which is therefore on. The voltage at the drain of the transistor N2 is therefore driven to the voltage level of the biasing voltage received at the source of the transistor N1, namely, $V_{SS}$. The voltage low level $V_{SS}$ of the node IN is applied to the gate of the transistor N1 which is therefore off. The transistor N1 therefore does not drive the node OUT' connected to its drain to any particular voltage.

The drain of the transistor N2 is connected to the output node OUT. Thus, the low voltage level $V_{SS}$ to which the transistor N2 drives the output node OUT, is received at the gate of the transistor P1. As a result, the transistor P1 is on and drives the output node OUT' connected to its drain to the voltage level of the biasing voltage received at its source, namely, $V_{DD}$. The large high voltage level $V_{DD}$, to which the transistor P1 drives the output node OUT', is received at the gate of the transistor P2. As a result, the transistor P2 is off and does not drive its drain, or the output node OUT, to any particular voltage. In short, the logic valued '0' input signal, with low voltage level $V_{SS}$ is level shifted or converted to an output signal outputted from output node OUT with low voltage level $V_{SS}$.

Now consider the steady-state case where the input signal applied to node IN is a logic '1', with small high voltage level $V_{CC}$. The inverter 20 outputs the complement of the input signal with logic value '0' and low voltage level $V_{SS}$ onto node IN'. The voltage level $V_{CC}$ of the node IN is applied to the gate of the transistor N1 which is therefore on. The transistor N1 therefore drives the node OUT' connected to its drain to the voltage level of the biasing voltage received at the source of the transistor N1, namely, $V_{SS}$. The low voltage level $V_{SS}$ of the node IN' is applied to the gate of the transistor N2 which is therefore off. The transistor N2 therefore does not drive the node OUT connected to its drain to any particular voltage.

The low voltage level $V_{SS}$ to which the transistor N1 drives the output node OUT', is received at the gate of the transistor P2. As a result, the transistor P2 is on and drives the node OUT connected to its drain to the voltage level of the biasing voltage received at its source, namely, $V_{DD}$. The large high voltage level $V_{DD}$, to which the transistor P2 drives the output node OUT, is received at the gate of the transistor P1. As a result, the transistor P1 is off and does not drive the output node OUT' connected to its drain to any particular voltage. In short, the logic valued '1' input signal, with small high voltage level $V_{CC}$ is level shifted or converted to an output signal outputted from output node OUT with large high voltage level $V_{DD}$.

There is a problem with the conventional level shifter circuit 10. Consider the transient response of the level shifter 10, for example, wherein the input signal transitions from the low voltage level $V_{SS}$ (logic '0') to the small high voltage level $V_{CC}$ (logic '1'). Prior to the transition, transistor P1 is on and drives the node OUT' to the large high voltage level $V_{DD}$ and transistor N1 is off. Transistor P2 is off and transistor N2 is on and drives the node OUT to the low voltage level $V_{SS}$. When the input signal transitions its voltage level, the voltage level applied to the node IN transitions from the low voltage level $V_{SS}$ to the small high voltage level $V_{CC}$. The inverter 20 therefore outputs the low voltage level $V_{SS}$ which is applied to node IN'. The low voltage level $V_{SS}$ at the node IN' turns off transistor N2. The small high voltage level $V_{CC}$ at the node IN turns on the transistor N1 which attempts to discharge the node OUT' and lower its voltage level from $V_{DD}$. The problem is that the transistor P1 is still on. In order to turn the transistor P1 off, the transistor P2 has to turn on. This can only happen if the turning on of the transistor N1 can drive the voltage level of the node OUT' sufficiently low to turn on the transistor P2. (Once the transistor P2 turns on, it drives the node OUT to $V_{DD}$. The large high voltage level $V_{DD}$ of the node OUT is applied to the gate of the transistor P1, thereby turning it off.) Consider now the transient response of the level shifter 10 wherein the input signal transitions from the small high voltage level $V_{CC}$ (logic '1') to the low voltage level $V_{SS}$ (logic '0'). In this latter case, the transistor N2 must drive the output node OUT sufficiently low to turn on the transistor P1.

To ensure that the transistor N1 can drive the node OUT' sufficiently low to turn on the transistor P2 (when a low voltage level $V_{SS}$ to small high voltage level $V_{CC}$ input signal transition occurs), and that the transistor N2 can drive the node OUT sufficiently low to turn on the transistor P1 (when a small high voltage level $V_{CC}$ to low voltage level $V_{SS}$ input signal transition occurs), the so-called "on-impedances" of the PMOS transistors P1 and P2 are made greater than the on-impedances of the NMOS transistors N2 and N1 under the same biasing conditions. The net effect is that when transistor N1 turns on during the $V_{SS}$ to $V_{CC}$ input signal transition, the node OUT' drops significantly below $V_{DD}/2$ and turns on the transistor P2. Likewise, when the transistor N2 turns on during the $V_{CC}$ to $V_{SS}$ input signal transition, the node OUT drops significantly below $V_{DD}/2$ and turns on the transistor P1.

However, the greater "on-impedances" of the transistors P1 and P2 have an undesirable effect of slowing the rise-time of the output signals. This is illustrated in FIG. 2 which graphically plots the voltage level of the input signal applied to node IN and the output voltage outputted from the node OUT' with respect to time. As shown, the transition from voltage level $V_{SS}$ (logic value '0') to voltage level $V_{CC}$ (logic value '1') of the input signal at time A results in a reasonably fast "fall" or transition from voltage level $V_{DD}$ to voltage level $V_{SS}$ in the signal outputted from the node OUT'. However, the input signal transition from voltage level $V_{CC}$ (logic value '1') to voltage level $V_{SS}$ (logic value '0') at time B results in a slow "rise" or transition from the voltage level $V_{SS}$ to the voltage level $V_{DD}$ in the output signal outputted from the node OUT'. A complementary disparity of a slow rise time (in response to the input signal transition at time A) and fast fall time (in response to the input signal transition at time B) is experienced at the node OUT. As a result, while the level shifter shown in FIG. 1 has some desirable features, such as simplicity, it is slow and has rather asymmetrical rise and fall times.

Other conventional embodiments of the level shifter 10 are known that are formed from inverters 30 and 40 that each have multiple PMOS transistors that are serially connected together in place of the single PMOS transistors P1 or P2. See U.S. Pat No. 4,039,862. The gate of one of the PMOS transistors of the serial connection is cross-coupled to the output of the other inverter. The gates of the other PMOS transistors of the serial connection are commonly connected to the gate of the NMOS transistor of the respective inverter. The operation of such level shifting inverters is very similar to the inverters 30 and 40. These other inverters with serial connections of multiple PMOS transistors suffer from the same transition rise time problem.

FIG. 3 shows another conventional level shifter circuit 11, which is disclosed in U.S. Pat. No. 4,695,744. As before, two level shifting inverters 31 and 41 are provided, the level shifting inverter 31 having transistors P1 and N1 and the level shifting inverter 41 having transistors P2 and N2. Furthermore, an inverter 21 is provided which receives an input signal, from a node IN, and outputs the complement of the input signal, to a node IN'. The node IN is connected to the gate of the transistor N1 and the node IN' is connected to the gate of the transistor N2. The node OUT' is connected to the drains of the transistors N1 and P1. The node OUT is connected to the drains of the transistors N2 and P2. The sources of the transistors P1 and P2 are connected to the $V_{DD}$ power supply bus. The sources of the transistors N1 and N2 are connected to the $V_{SS}$ power supply bus. The gate of the transistor P1 is connected to the node OUT and the gate of the transistor P2 is connected to the node OUT'.

In addition, an NMOS transistor N3 is connected in a source follower configuration with its gate connected to the node IN', its source connected to the node OUT' and its drain connected to the $V_{CC}$ power supply bus. Likewise, an NMOS transistor N4 is connected in a source follower configuration with its gate connected to the node IN, its source connected to the node OUT and its drain connected to the $V_{CC}$ power supply bus. During steady state operation, the transistors N3 and N4 are off and play no role in the generation of voltage levels at the nodes OUT and OUT'. For instance, when the input signal applied to IN is a low voltage level $V_{SS}$, transistor N4 receives the low voltage $V_{SS}$ of the node IN at its gate and is off. Transistor N3 receives the small high voltage level $V_{CC}$ of the node IN' at its gate. However, the transistor N1 is off and transistor P1 is on. Therefore, the node OUT' is driven by the transistor P1 to the large high voltage level $V_{DD}$. Thus, the large high voltage level $V_{DD}$ of the node OUT' is applied to the drain of the transistor N3. Because the drain voltage of the transistor N3 is greater than the gate voltage ($V_{CC}$) and source voltage ($V_{CC}$) of the transistor N3, the transistor N3 is off. In the case that the input signal applied to the node IN is $V_{CC}$ then the transistor N3 will be off because of the low voltage level $V_{SS}$ applied to its gate from node IN'. The transistor N4 will be off because the transistor P2 will drive the node OUT to $V_{DD}$ thereby applying a greater voltage level ($V_{DD}$) to the drain of the transistor N4 than the voltage level ($V_{CC}$ from the node IN) applied to its gate and the voltage level ($V_{CC}$) applied to its source. In short, the steady state operation of the level shifter 11 is similar to the steady state operation of the inverter 10 of FIG. 1.

Now consider the transient operation of the inverter 11. Assume that the input signal is initially a low voltage level $V_{SS}$ (logic '0') and then transitions to a small high voltage level $V_{CC}$ (logic '1'). The voltage level of the node IN increases to the small high voltage level $V_{CC}$ and the voltage level on the node IN' decreases to the low voltage level $V_{SS}$. The transistor N3, which receives the low voltage $V_{SS}$ from the node IN' at its gate remains off. As before, the transistor N1 turns on. In addition, the transistor N4 turns on because it receives the small high voltage level $V_{CC}$ at its gate from the node IN. Note that this is possible since the voltage level applied to the drain of the transistor N4 via the node OUT is initially at a low voltage near $V_{SS}$ and rises more slowly than the voltage level of the node IN. Since the transistor N4 is on, the transistor charges the node OUT and drives it to the voltage level $V_{CC}-V_T$ where $V_T$ is the threshold voltage of the transistor N4. When the node OUT reaches the voltage level $V_{CC}-V_T$, the drain voltage of the transistor N4 becomes too high for the transistor N4 to remain on. As such, the transistor N4 turns off. However, by virtue of the transistor N4 being on initially when the transition occurs, the transistor N4 charges up the node OUT more quickly than during the corresponding input signal voltage level transition at level shifter 10 of FIG. 1. As such, the transistor P1 turns off at an earlier time so that the transistor N1 can discharge the node OUT' (and drive it to $V_{SS}$) more completely and at an earlier time. This in turn causes the transistor P2 to turn on more completely and at an earlier time so as to drive the node OUT up to the large high voltage level $V_{DD}$ at an earlier time.

The converse transition time is decreased by the transistor N3. Assume that the input signal voltage level is initially the small high voltage level $V_{CC}$ (logic '1') and then transitions to the low voltage level $V_{SS}$ (logic '0'). This causes the voltage level at node IN to transition to $V_{SS}$ and the voltage at node IN' to transition to $V_{CC}$. Thus, transistor N1 turns off, transistor N4 remains off, and transistors N2 and N3 turn on. Again, transistor N3 turns on because it receives the small high voltage level $V_{CC}$ from the node IN' at its gate and because the voltage level applied to its drain from the node OUT' rises more slowly from its low level of $V_{SS}$ than the voltage level at the node IN'. Transistor N3 therefore charges the node OUT' thereby increasing its voltage level to $V_{CC}-V_T$. When the node OUT' reaches the voltage level $V_{CC}-V_T$, the transistor N3 turns off. However, the voltage level at the node OUT' rises much more quickly than during the corresponding $V_{CC}$ to $V_{SS}$ input signal transition at the level shifter 10 shown in FIG. 1. This causes the transistor P2 to turn off at an earlier time thereby enabling the transistor N2 to discharge the node OUT (and drive it to $V_{SS}$) more completely and at an earlier time. As a result, the transistor P1 turns on more completely and at an earlier time so as to drive the node OUT' to the large high voltage $V_{DD}$ at an earlier time.

The level shifter 11 therefore reduces switching time and decreases the asymmetry between the fall and rise times of the nodes OUT and OUT'. This is achieved with "transition" driver transistors N3 and N4 which charge up the node OUT or OUT' to speed up the switching of the transistors P1 and P2 during a voltage level transition of the input signal. Note that only one of the transition drivers N3 or N4 operates during each transition; the other transistor is idle. Thus, the transition drivers N3 and N4 are not used to their fullest potential. Furthermore, note that the transistors N3 and N4 can only assist in charging up the nodes OUT' or OUT to $V_{CC}-V_T$. The transistors P1 or P2 must charge the nodes OUT' or OUT from the $V_{CC}-V_T$ voltage level to the $V_{DD}$ voltage level without assistance.

FIG. 4 shows yet another conventional level shifter 12 which is disclosed in U.S. Pat. No. 4,532,436. The level shifter 12 has first and second steady-state drivers 32 and 42, and an inverter 22 similar to those described above in FIGS. 1 and 3. The driver 32 includes transistors N1 and P1 and the driver 42 includes the transistors N2 and P2. Also provided is transient driver circuitry 60, 70 and 80 including first and second transient drivers 60 and 70 and a memory 80.

The transient driver 60 includes PMOS transistors P1A and P1B. The source of the transistor P1A is connected to the $V_{DD}$ power supply bus, the gate of the transistor P1A is connected to the node OUT and the drain of the transistor P1A is connected to the source of the transistor P1B. The drain of the transistor P1B is connected to the node OUT' and the gate of the transistor P1B is connected to an output Q' of the memory circuit 80.

The transient driver 70 includes PMOS transistors P2A and P2B. The source of the transistor P2A is connected to the $V_{DD}$ power supply bus, the gate of the transistor P2A is connected to the node OUT' and the drain of the transistor P2A is connected to the source of the transistor P2B. The drain of the transistor P2B is connected to the node OUT and the gate of the transistor P2B is connected to an output Q of the memory circuit 80.

The memory circuit 80 includes two $V_{SS}$, $V_{DD}$ voltage level logic NOR gates C1 and C2 connected in an RS flip-flop configuration. That is, the output Q of the gate C2 is fed back as one input to the gate C1 and the output Q' of the gate C1 is fed back as one input to the gate C2. The gate C1 receives the voltage at the node OUT as a second input and the gate C2 receives the voltage at the node OUT' as a second input. The memory 80 therefore stores the previous logic output state of the nodes OUT and OUT'. That is, when the voltage level of the nodes OUT and OUT' are large high $V_{DD}$ (logic '1') and low $V_{SS}$ (logic '0'), respectively, the memory 80 outputs the voltage levels from the nodes Q and Q' low $V_{SS}$ (logic '1') and large high $V_{DD}$ (logic '1'), respectively. Likewise, when the voltage levels of the nodes OUT and OUT' are low $V_{SS}$ and large high $V_{DD}$, respectively, the memory 80 outputs the voltage levels from the nodes Q and Q' large high $V_{DD}$ (logic '1') and low $V_{SS}$ (logic '0'), respectively.

The steady state operation of the level shifter 12 is as follows. Assume that the input signal applied to IN is the low voltage level $V_{SS}$ (logic '1') and thus the voltage level of the node IN' is the small high voltage level $V_{CC}$ (logic '1'). As such transistors N2 and P1 are on and transistors N1 and P2 are off. The node OUT is driven by transistor N2 to the low voltage level $V_{SS}$ and the node OUT' is driven by the transistor P1 to the large high voltage level $V_{DD}$. With OUT at the low voltage level $V_{SS}$ and OUT' at the high voltage level $V_{DD}$, the memory 80 outputs the large high voltage level $V_{DD}$ onto the node Q' and the low voltage level $V_{SS}$ onto the node Q.

The low voltage level $V_{SS}$ of the node OUT is received at the gate of the transistor P1A which is therefore fully on. However, the large high voltage level $V_{DD}$ of the node Q' is received at the gate of the transistor P1B which is therefore off. As such, the transient driver 60 does not drive the node OUT'.

The low voltage level $V_{SS}$ of the node Q is received at the gate of the transistor P2B which is therefore fully turned on. However, the large high voltage level $V_{DD}$ of the node OUT' is received at the gate of the transistor P2A which is therefore fully off. As such, the transient driver 70 does not drive the node OUT.

Consider now the steady-state operation of the level shifter 12 when the input signal is the small high voltage level $V_{CC}$ (logic '1'). The voltage level of the node IN' therefore is the low voltage level $V_{SS}$ (logic '0'). As such transistors N1 and P2 are on and transistors N2 and P1 are off. The node OUT' is driven by transistor N1 to the low voltage level $V_{SS}$ and the node OUT is driven by the transistor P2 to the large high voltage level $V_{DD}$. With OUT' at the low voltage level $V_{SS}$ and OUT at the high voltage level $V_{DD}$, the memory 80 outputs the large high voltage level $V_{DD}$ onto the node Q and the low voltage level $V_{SS}$ onto the node Q'.

The low voltage level $V_{SS}$ of the node OUT' is received at the gate of the transistor P2A which is therefore fully turned on. However, the large high voltage level $V_{DD}$ of the node Q is received at the gate of the transistor P2B which is therefore fully turned off. As such, the transient driver 70 does not drive the node OUT.

The low voltage level $V_{SS}$ of the node Q' is received at the gate of the transistor P1B which is therefore fully turned on. However, the large high voltage level $V_{DD}$ of the node OUT is received at the gate of the transistor P1A which is therefore fully turned off. As such, the transient driver 60 does not drive the node OUT'.

The transient operation of the level shifter 12 is now described. Consider first a low voltage level $V_{SS}$ (logic '0') to small high voltage level $V_{CC}$ (logic '1') input signal transition. Initially, the node IN is at the low voltage level $V_{SS}$ and the node IN' is at the small high voltage level $V_{CC}$. The transistor N2 is on and the transistor N1 is off. The node OUT is at the voltage level $V_{SS}$ and the node OUT' is at the voltage level $V_{DD}$. Thus, the transistors P1 and P1A are on and the transistors P2 and P2A are off. The node Q is at the low voltage level $V_{SS}$ and the node Q' is at the voltage level $V_{DD}$. Thus, the transistor P2B is on and the transistor P1B is off. When the transition occurs, the transistor N2 quickly turns off and the transistor N1 quickly turns on. The transistor N1 begins to discharge the node OUT' and drive it to $V_{SS}$. The transistor N1 is bigger than the transistor P1 and therefore can easily drive the voltage substantially below $V_{DD}/2$. As such, both the transistors P2 and P2A turn on. Note that the transistor P2B is also on. Thus, both the transistors P2 and P2A charge up the node OUT and steadily drive up the voltage level of the node OUT from $V_{SS}$ to $V_{DD}$. The increase in voltage at the node OUT causes the transistors P1 and P1A to turn off and reduce their drive of the node OUT', thereby enabling the transistor N1 to fully discharge and drive the node OUT' to $V_{SS}$. Eventually, by virtue of the transistor N1 driving down the voltage of the node OUT', the gate C2 ceases to output the low voltage level $V_{SS}$ (logic '0') at node Q and instead outputs the large high voltage level $V_{DD}$ (logic '1') at the node Q. This fully disables the transistor P2B and prevents any current generated by the transistor P2A from being supplied to, and from charging up, the node OUT. As such, the driver 70 is disabled and only the transistor P2 drives the node OUT. The charging up, and drive of the node OUT to the large high voltage level $V_{DD}$ also transitions the voltage level outputted from the gate C1 to the low voltage level $V_{SS}$ (logic '0') instead of the large high voltage level $V_{DD}$ (logic '1'). This enables the transistor P1B. However, by that time, the voltage level of the node OUT is sufficiently high to disable the transistor P1A. Thus, no drive current is generated in the driver 60 for supply to the node OUT'.

Consider now a small high voltage level $V_{CC}$ (logic '1') to low voltage level $V_{SS}$ (logic 'o') input signal transition. Initially, the node IN is at the small high voltage level $V_{CC}$ and the node IN' is at the low voltage level $V_{SS}$. The transistor N1 is on and the transistor N2 is off. The node OUT is at the voltage level $V_{DD}$ and the node OUT' is at the voltage level $V_{SS}$. Thus, the transistors P2 and P2A are on and the transistors P1 and P1A are off. The node Q' is at the low voltage level $V_{SS}$ and the node Q is at the voltage level $V_{DD}$. Thus, the transistor P1B is on and the transistor P2B is off. When the transition occurs, the transistor N1 quickly turns off and the transistor N2 quickly turns on. The transistor N2 begins to discharge the node OUT and drive it to $V_{SS}$. The transistor N2 is bigger than the transistor P2 and therefore can easily drive the voltage of the node OUT substantially below $V_{DD}/2$. As such, both the transistors P1 and P1A turn on. Note that the transistor P1B is also on. Thus, both the transistors P1 and P1A charge up the node OUT', and steadily drive up the voltage level of the node OUT' from $V_{SS}$ to $V_{DD}$. The increase in voltage at the node OUT' causes the transistors P2 and P2A to turn off and reduce their drive of the node OUT, thereby enabling the transistor N2 to fully discharge and drive the node OUT to $V_{SS}$. Eventually, by virtue of the transistor N2 driving down the voltage of the node OUT, the gate C1 ceases to output the low voltage level $V_{SS}$ (logic '0') at node Q' and instead outputs the large high voltage level $V_{DD}$ (logic '1') at the node Q'. This fully disables the transistor P1B and prevents any current generated by the transistor P1A from being supplied to, and from charging up, the node OUT'. As such, the driver 60 is disabled and only the transistor P1 drives the node OUT'. The charging up, and drive of the node OUT to the large high voltage level $V_{DD}$ also transitions the voltage level outputted from the gate C2 to the low voltage level $V_{SS}$ (logic '0') from the large high voltage level $V_{DD}$ (logic '1'). This enables the transistor P2B. However, by that time, the voltage level of the node OUT' is sufficiently high to disable the transistor P2A. Thus, no drive current generated in the driver 70 is supplied to the node OUT.

The steady-state driving transistors P1 and P2 are made smaller than the transistors N1 and N2 with higher "on-impedances". For instance, the "on-impedances" of the transistors P1 and P2 may be 100 times the "on-impedances" of the transistors N1 and N2. As noted above, this enables the transistors N1 and N2 to drive their respective nodes OUT' or OUT sufficiently below $V_{DD}/2$ so as to turn on the transistor P2 or P1 of the other driver 42 or 32. In order to speed up the rise time of such small transistor P1 and P2, the transient drivers 60 or 70 are momentarily engaged during a transition in the input signal voltage level. The transient drivers 60 and 70 have very large transistors P1A, P1B, P2A and P2B. Thus, the transient driver 60 can assist the transistor P1 in quickly charging up the node OUT' and thereby achieve the large high voltage level $V_{DD}$ much more quickly. Likewise, the transient driver 70 can assist the transistor P2 in quickly charging up the node OUT to achieve the large high voltage level $V_{DD}$ thereat more quickly. (Note that only one transient driver 60 or 70 is engaged during each transition of the input signal voltage level, the transient driver 60 being engaged during a $V_{CC}$ to $V_{SS}$ input signal voltage level transition and the transient driver 70 being engaged during a $V_{SS}$ to $V_{CC}$ input signal voltage level transition). The transient driver 60 is not engaged during the $V_{SS}$ to $V_{CC}$ input signal transition, at which time the transistor N1 is discharging the node OUT'. Nor is the transient driver 70 engaged during the $V_{CC}$ to $V_{SS}$ input signal voltage level transition, at which time the transistor N2 is discharging the node OUT. Thus, the transient drivers 60 and 70 serve only to speed up the rise time, and do not slow down the fall time, of the respective nodes OUT' or OUT to which they are attached.

The problem with the level shifter 12 of FIG. 4 is that two large PMOS transistors P1A and P1B or P2A and P2B must be provided for each transient driver 60 or 70. Furthermore, each of the transient drivers 60 or 70 requires two different enable inputs. A first enable signal is supplied from the memory 80 to the transistor P1B or P2B. The first enable signal is either $V_{DD}$ or $V_{SS}$ and therefore either fully conducts, or fully blocks, the current generated by the transistor P1A or P2A of driver 60 or 70 to its connected node OUT' or OUT. A second enable signal is applied from the node OUT' to the gate of the transistor P2A of the driver 70 or from the node OUT to the gate of the transistor P1A of the driver 60. The second enable signal starts out at the large high voltage level $V_{DD}$ and decreases to $V_{SS}$. As such, the second enable signal varies the current, and thus the drive, of the transistor P1A of the driver 60 or of the transistor P2A of the driver 70 in inverse proportion to the drop in voltage level of this enable signal. Stated another way, the drive of the driver 60 or 70 varies continuously, throughout the period during which the driver 60 or 70 is activated, from a very low level to the maximum drive capacity of the driver 60 and 70. Again, the drive of the driver 60 varies in inverse proportion to the drop in voltage from $V_{DD}$ to $V_{SS}$ of the node OUT from which the second enable signal is received. Likewise, the drive of the driver 70 varies in inverse proportion to the drop in voltage from $V_{DD}$ to $V_{SS}$ of the node OUT' from which the second enable signal is received. This is disadvantageous because the maximum drive capacity of the drivers 60 and 70 is not used throughout their activation period so as to optimally minimize the time required to charge up the node to which they are attached.

U.S. Pat. No. 4,980,583 teaches a level shifter circuit similar to that described in U.S. Pat. No. 4,532,436. In particular, the level shifter circuit of U.S. Pat. No. 4,980,583 has transient driver circuitry in the form of additional PMOS transistors for assisting in driving the voltage of the node OUT or OUT' up to $V_{DD}$ when the inputted voltage applied to IN transitions its logic value. Unlike U.S. Pat. No. 4,532,436, the transient driver circuit includes only two additional PMOS transistors, one connected to the output node OUT and one connected to the output node OUT'. Like U.S. Pat. No. 4,532,436, an enable circuit is provided in the form of a memory circuit including two cross-coupled NAND gates. Connected to the memory circuit are additional NAND gates which output an enabling signal to one of the two additional PMOS transistors of the transient driver circuit, depending on the polarity of the transition of the input signal. The enable circuitry enables only one of the two PMOS transient drivers and only for a certain period of time, when a transition occurs in the inputted signal.

The reference F. S. Lai & W. Hwang, *Differential Cascode Voltage Switch with the Pass-Gate (DCVSPG) Logic Tree for High Performance CMOS Digital Systems*, 1993 INTER'L SYM. VLSI TECH., SYS. & Apps., P. 358–362, May 12, 1993 discusses certain issues pertinent to all differential cascode logic circuits. Specifically, this reference notes that the cascode logic circuits suffer from a "floating node" problem in the NMOS transistors of the circuits. To overcome this problem, this reference teaches to use pass gates, in the form of NMOS transistors, that provide additional charge and discharge paths for the outputs of the NMOS transistors.

It is an object of the present invention to overcome the disadvantages of the prior art.

SUMMARY OF THE INVENTION

This and other objects are achieved by the present invention. According to one embodiment, a level shifter is provided with first and second steady-state drivers and transient driver circuitry. Each steady-state driver includes a low enable input, a high enable input and an output. Each steady-state driver outputs from its respective output a low voltage level signal when an enabling voltage level is received at its low enable input and a disabling voltage is received at its high enable input. Furthermore, each steady-state driver outputs from its output a first high voltage level signal, that is higher than a second high voltage level of an input signal, when a disabling voltage level is received at its low enable input and an enabling high voltage level is received at its high enabling input. The high enable input of the first steady-state driver is connected to the output of the second steady-state driver. The high enable input of the second steady-state driver is connected to the output of the first steady-state driver. The input of the first steady-state driver receives a complement of the input signal and the input of the second steady-state driver receives the input signal. The transient driver circuitry responds to a transition in the voltage level of the input signal by driving the output of one of the first and second drivers, to the first high voltage level, for a certain time period. The transient driver circuitry is enabled to drive the output with a maximum driving capacity throughout the aforementioned certain time period.

Illustratively, the transient driver monitors the voltage levels of the outputs of the first and second steady state drivers and detects an input signal voltage level transition if one of the output voltage levels falls from the first high voltage level. The transient driver circuitry illustratively may be provided with a first MOS transistor connected to the output of the first steady-state driver and a second MOS transistor connected to the output of the second steady state driver. In response to detecting a fall in the voltage level of the output of the first steady state driver, the transient driver illustratively enables the second MOS transistor to drive the second output, with the maximum drive capacity of the second MOS transistor, to the first high voltage level. Likewise, in response to detecting a fall in the voltage level of the output of the second steady state driver, the transient driver illustratively enables the first MOS transistor to drive the second output, with the maximum drive capacity of the first MOS transistor, to the first high voltage level.

In short, transient driver circuitry is provided which is only enabled during a transition to help charge one of the output nodes of the steady-state drivers. When enabled, the transient driver circuitry drives one of the two output nodes with its maximum drive capacity, which maximum drive capacity is capable of driving the respective output node to the first high voltage level. Such transient driver circuitry markedly reduces the rise time of the output of the respective steady-state driver yet does not affect the fall time of the steady-state driver.

BRIEF DESCRIPTION OF THE DRAWING

FIGS. 8–9 plot the simulated transient response of the level shifter according to the first embodiment of the present invention of FIG. 5.

DETAILED DESCRIPTION OF THE INVENTION

Figure 5:
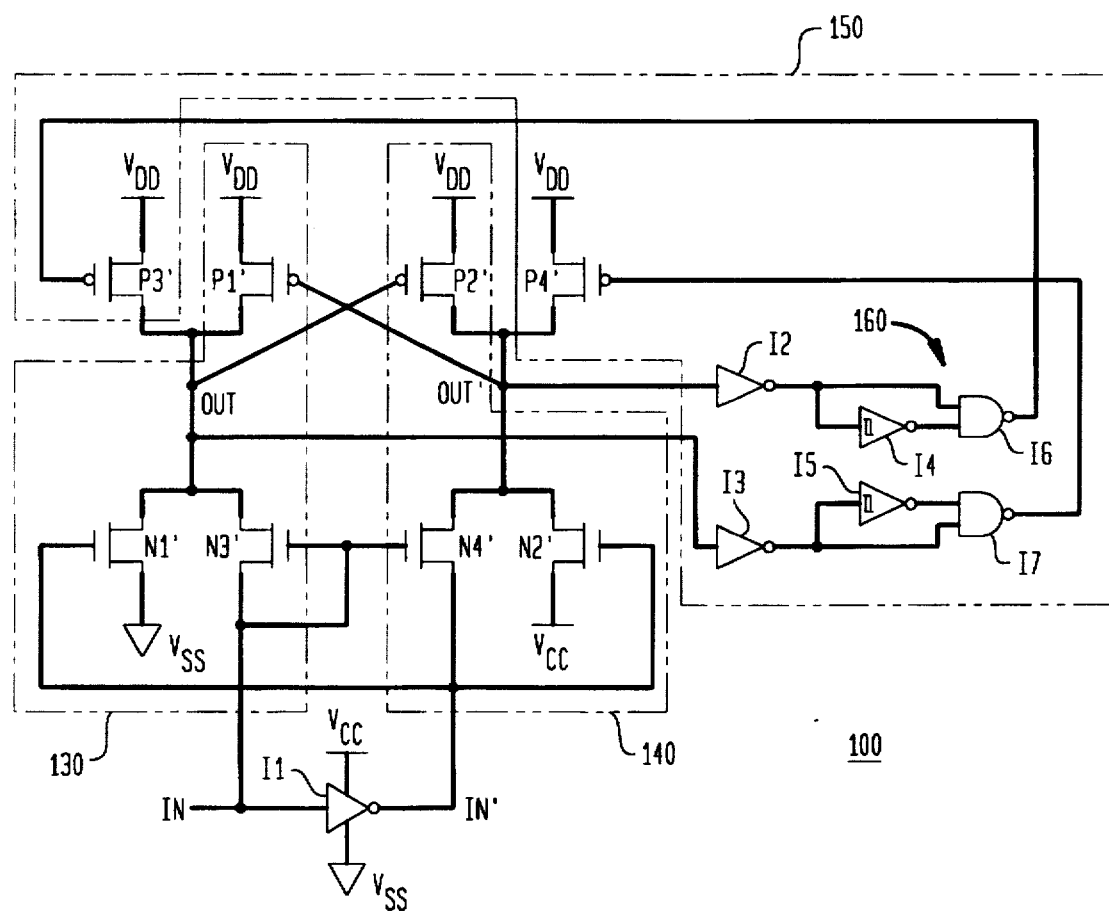
FIG. 5 shows a level shifter with transient driver circuitry according to a first embodiment of the present invention.

FIG. 5 shows a level shifter 100 according to an embodiment of the present invention. As shown, the level shifter 100 has steady-state driving circuitry including, a first steady-state driver 130, a second steady-state driver 140 and an inverter I1. The inverter I1 receives an input signal from the node IN and outputs a complement of the input signal onto the node IN'. (As shown, the inverter I1 is biased with the small high voltage $V_{CC}$ and the low voltage $V_{SS}$ so that the complement of the input signal falls within the same voltage level range as the input signal, namely, $V_{SS}$ to $V_{CC}$.)

The first driver 130 includes a PMOS transistor P1' having a source connected to the large high voltage $V_{DD}$ power supply bus, and a drain connected to the node OUT. The first driver also includes two NMOS transistors N1' and N3'. Illustratively, the NMOS transistors N1' and N3' are connected in a pass-gate configuration which speeds up the response of the steady-state driver 130. See F. S. Lai & W. Hwang, *Differential Cascade Voltage Switch with Pass Code (DCVSPG) Logic Tree for High Performance CMOS Digital Systems*, 1993, INTER'L SYM. VLSI TECH., SYS. & Apps., p. 358–62, May 12, 1993. For instance, the transistor N1' has a drain connected to the node OUT, a source connected to the low voltage $V_{SS}$ power supply bus and a gate connected to the node IN'. The transistor N3' has a drain connected to the node OUT and a source and a gate connected to the node IN.

The second driver 140 includes a PMOS transistor P2' having a source connected to the large high voltage $V_{DD}$ power supply bus, and a drain connected to the node OUT'. The second driver 140 also includes two NMOS transistors N2' and N4'. Illustratively, the NMOS transistors N2' and N4" are connected in a configuration which speeds up the response of the steady state driver 140. However, the transistors N2' and N4' need not be connected in a similar fashion as the transistors N1' and N3'. For instance, the transistor N2' has its drain connected to the node OUT', its gate connected to the node IN' and its source connected to the small high voltage $V_{CC}$ power supply bus. The transistor N4' has its drain connected to the node OUT', its gate connected to the node IN and its source connected to the node IN'.

As shown, the gate of the transistor P1' serves as the high enable input of the driver 130 and is connected to the output node OUT' of the other driver 140. The gate of the transistor N1' serves as the low enable input of the driver 130. Likewise, the gate of the transistor P2' serves as the high enable input of the driver 140 and is connected to the output node OUT of the other driver 130. The gate of the transistor N4' serves as the low enable input of the driver 140.

The level shifter 100 also has transient driver circuitry 150, including an enable/level detection circuit 160, a transistor P3' and a transistor P4'. The enable circuitry 160 includes an inverter I2 which receives the voltage level of the node OUT' and outputs the complement of the voltage level of the node OUT'. The enable circuitry 160 also has an inverter I3 which receives the voltage level of the node OUT and outputs the complement of the voltage level of the node OUT. Illustratively, the inverters I2 and I3 are designed so as to output a continuous range of voltage levels equal to $V_{DD}$—the voltage level of the node OUT' or OUT, respectively.

The complement of the voltage level of the node OUT' is outputted from the inverter I2 to a level detecting inverter I4. The level detecting inverter I4 illustratively is a Schmidt trigger such as is described in U.S. Pat. No. 5,063,308. A Schmidt trigger is a circuit which outputs a high voltage when the inputted voltage level is below a predefined "trip" voltage level and otherwise outputs a low voltage level. The voltage levels outputted from the inverter I4 and the inverter I2 are received as inputs at a NAND gate I6. The NAND gate I6 is designed to output one of two discrete voltage levels, namely, the low voltage level $V_{SS}$, when both inputted voltage levels represent a logic '1', or the large high voltage level $V_{DD}$ otherwise. The output of the NAND gate I6 is inputted to the gate of the transistor P3'.

The complement of the voltage level of the node OUT is outputted from the inverter I3 to a second level detecting inverter I5, which may also be a Schmidt trigger. The voltage level outputted from the inverters I3 and I5 are received as inputs at a NAND gate I7. The NAND gate I7 is designed to output one of two discrete voltage levels, namely, the low voltage level $V_{SS}$, when both inputted voltage levels represent a logic '1', or the large high voltage level $V_{DD}$ otherwise. The output of the NAND gate I7 is inputted to the gate of the transistor P4'.

The steady-state operation of the level shifter 100 is first considered. Assume that the input signal applied to the node IN is the low voltage level $V_{SS}$. The inverter I1, therefore outputs the small high voltage level $V_{CC}$ onto the node IN'. The transistors N3' and N4' are off because their gates receive the low voltage level $V_{SS}$ from the node IN. The transistors N1' and N2' are on because their gates receive the small high voltage $V_{CC}$ from the node IN'. The transistor N1' drives the node OUT to $V_{SS}$. The transistor P2' receives the low voltage level $V_{SS}$ of the node OUT and is therefore on. As such, the transistor P2' drives the node OUT' to the large high voltage level $V_{DD}$. The large high voltage level $V_{DD}$ of the node OUT' is applied to the gate of the transistor P1' which is therefore off. Consider that while the transistor N2' is on, its drain is at a higher voltage, namely, the large high voltage level $V_{DD}$, than its source and gate, which both are at the small high voltage $V_{CC}$. The transistor N2' therefore does not drive the node OUT'.

With the node OUT' at the large high voltage, the inverter I2 outputs the low voltage level $V_{SS}$, or logic '0' to the NAND gate I6. The inverter I4 receives the low voltage level $V_{SS}$ outputted from the inverter I2 and outputs the large high voltage level $V_{DD}$ to the NAND gate I6. Thus, the NAND gate I6 outputs a large high voltage level $V_{DD}$ to the gate of the transistor P3' which is therefore off. The inverter I3 receives the low voltage level $V_{SS}$ of the node OUT and outputs the large high voltage level $V_{DD}$ to the NAND gate I7. The inverter I5 receives the high voltage level $V_{DD}$ outputted from the inverter I3 and outputs the low voltage level $V_{SS}$ to the NAND gate I7. Thus, the NAND gate I7 outputs the high voltage level $V_{DD}$ to the gate of the transistor P4' which is therefore off.

In short, when the input signal is the low voltage level $V_{SS}$ (logic '0'), the transistor N1' drives the node OUT to the low voltage level $V_{SS}$ and the transistor P2' drives the node OUT' to the large high voltage level $V_{DD}$.

Assume now that the input signal applied to the node IN is the small high voltage level $V_{CC}$. The inverter I1, therefore outputs the low voltage level $V_{SS}$ onto the node IN'. The transistors N1' and N2' are off because their gates receive the low voltage level $V_{SS}$ from the node IN'. The transistors N3' and N4' are on because their gates receive the small high voltage $V_{CC}$ from the node IN. The transistor N4' drives the node OUT' to the voltage received at its source, namely, the low voltage level $V_{SS}$ of the node IN'. The transistor P1' receives the low voltage level $V_{SS}$ of the node OUT' and is therefore on. As such, the transistor P1' drives the node OUT to the large high voltage level $V_{DD}$. The large high voltage level $V_{DD}$ of the node OUT is applied to the gate of the transistor P2' which is therefore off. Consider that while the transistor N3' is on, its drain is at a higher voltage, namely, the large high voltage level $V_{DD}$, than its source and gate, which both are at the small high voltage $V_{CC}$. The transistor N3' therefore does not drive the node OUT.

With the node OUT at the large high voltage, the inverter I3 outputs the low voltage level $V_{SS}$, or logic '0' to the NAND gate I7. The inverter I5 receives the low voltage level $V_{SS}$ outputted from the inverter I3 and outputs the large high voltage level $V_{DD}$ to the NAND gate I7. Thus, the NAND gate I7 outputs a large high voltage level $V_{DD}$ to the gate of the transistor P4' which is therefore off. The inverter I2 receives the low voltage level $V_{SS}$ of the node OUT' and outputs the large high voltage level $V_{DD}$ to the NAND gate I6. The inverter I4 receives the high voltage level $V_{DD}$ outputted from the inverter I2 and outputs the low voltage level $V_{SS}$ to the NAND gate I6. Thus, the NAND gate I6 outputs the high voltage level $V_{DD}$ to the gate of the transistor P3' which is therefore off.

In short, when the input signal is the small high voltage level $V_{CC}$ (logic '1'), the transistor N4' drives the node OUT' to the low voltage level $V_{SS}$ and the transistor P1' drives the node OUT to the large high voltage level $V_{DD}$.

The transient response of the level shifter is now described. The response of the drivers 130 and 140 is reviewed separately from the response of the transient driver circuitry 150. Consider first the transient response when the input signal transitions from the low voltage level $V_{SS}$ (logic '0') to the small high voltage level (logic '1'). Prior to the transition, the node OUT is at the low voltage level $V_{SS}$ and the node OUT' is at the large high voltage level $V_{DD}$. When the transition first occurs, the node IN transitions from the low voltage level $V_{SS}$ to the small high voltage level $V_{CC}$ and the node IN' transitions from the small high voltage level $V_{CC}$ to the low voltage level $V_{SS}$. This turns off the transistors N1' and N2' and turns on the transistors N3' and N4'. The transistor N3' thus charges up the node OUT until the node OUT reaches the voltage level $V_{CC}$-$V_T$ where $V_T$ is the threshold voltage of the transistor N3'. When the node OUT reaches the voltage level $V_{CC}$-$V_T$, the drain voltage of the transistor N3' is too great (in comparison to the gate and source voltages of the transistor N3') for the transistor N3' to continue conducting. Meanwhile, the transistor N4' discharges the node OUT' down to the voltage of its source, namely, the low voltage $V_{SS}$ of the node IN'.

As the voltage of the node OUT rises up from the low voltage $V_{SS}$, the transistor P2' begins to turn off. This lowers the voltage of the node OUT' and enables the transistor N4' to fully discharge and drive the node OUT' to the low voltage $V_{SS}$. As the voltage level of the node OUT' falls from the large high voltage level $V_{DD}$, the transistor P1' begins to turn on and charge the node OUT, thereby driving it to the large high voltage $V_{DD}$. Eventually, as the node OUT reaches the large high voltage level $V_{DD}$ the transistor P2' fully turns off. Likewise, as the node OUT' reaches the low voltage level $V_{SS}$, the transistor P1' fully turns on.

Consider now the response of the transient driver circuitry 150. As the transistor N4' discharges and drives down the voltage level of the node OUT', the voltage level outputted from the inverter I2 rises. Invariably, the rising voltage outputted from the inverter I2 is high enough to represent a logic '1' value. At this point, two logic '1' valued signals are received at the NAND gate I6. In response, the NAND gate I6 outputs a low voltage level $V_{SS}$ to the gate of the transistor P3'. The transistor P3' responds by fully turning on and charging and driving the node OUT, with its maximum drive capacity to the large high voltage level $V_{DD}$. Note that the transistor can be substantially bigger than the transistors P1' and P2'. As such, the node OUT quickly charges up to the large high voltage level $V_{DD}$. This causes the transistor P2' to turn off faster thereby enabling the transistor N4' to discharge the node OUT' more completely and more quickly.

Invariably, the voltage level of the node OUT' falls sufficiently low such that the voltage level outputted from the inverter I2 exceeds a "trip" level of the level detecting inverter I4. When the voltage level outputted from the inverter I2 rises above the trip level, the level detecting inverter I4 changes its output to the low voltage $V_{SS}$. At such time, the NAND gate I6 receives a logic '1' input (from the inverter I2) and a logic '0' input (from the level detecting inverter I5) thereby causing the NAND gate I6 to transition its output to the large high voltage level $V_{DD}$. This completely shuts off the transistor P3' so that only the transistor P1' drives the node OUT to the large high voltage level $V_{DD}$. The net effect is that the enable circuitry 160 enables the transistor P3' to drive the node OUT at its maximum drive capacity, but only for a certain period of time. Nevertheless, the drive provided by the large transistor P3' substantially reduces the time required for the node OUT to rise to the large high voltage level $V_{DD}$.

Assume now that the input signal transitions from the small high voltage level $V_{CC}$ (logic '1') to the low voltage level (logic '0'). Prior to the transition, the node OUT' is at the low voltage level $V_{SS}$ and the node OUT is at the large high voltage level $V_{DD}$. When the transition first occurs, the node IN' transitions from the low voltage level $V_{SS}$ to the small high voltage level $V_{CC}$ and the node IN transitions from the small high voltage level $V_{CC}$ to the low voltage level $V_{SS}$. This turns on the transistors N1' and N2' and turns off the transistors N3' and N4'. The transistor N2' thus charges up the node OUT' until the node OUT' reaches the voltage level $V_{CC}$-$V_T$ where $V_T$ is the threshold voltage of the transistor N2'. When the node OUT' reaches the voltage level $V_{CC}$-$V_T$, the drain voltage of the transistor N2' is too great (in comparison to the gate and source voltages of the transistor N2') for the transistor N2' to continue conducting. Meanwhile, the transistor N1' discharges the node OUT down to the low voltage $V_{SS}$.

As the voltage of the node OUT' rises up from the low voltage $V_{SS}$, the transistor P1' begins to turn off. This lowers the voltage of the node OUT and enables the transistor N1' to fully discharge and drive the node OUT to the low voltage $V_{SS}$. As the voltage level of the node OUT falls from the large high voltage level $V_{DD}$, the transistor P2' begins to turn on and charge the node OUT', thereby driving it to the large high voltage $V_{DD}$. Eventually, as the node OUT' reaches the large high voltage level $V_{DD}$ the transistor P1' fully turns off. Likewise, as the node OUT reaches the low voltage level $V_{SS}$, the transistor P2' fully turns on.

Consider now the response of the transient driver circuitry 150. As the transistor N1' discharges and drives down the voltage level of the node OUT, the voltage level outputted from the inverter I3 rises. Invariably, the rising voltage outputted from the inverter I3 is high enough to represent a logic '1' value. At this point, two logic '1' valued signals are received at the NAND gate I7. In response, the NAND gate I7 outputs a low voltage level $V_{SS}$ to the gate of the transistor P4'. The transistor P4' responds by fully turning on and charging and driving the node OUT', with its maximum drive capacity, to the large high voltage level $V_{DD}$. Note that the transistor P4' can be substantially bigger than the transistors P1' and P2'. As such, the node OUT' quickly charges up to the large high voltage level $V_{DD}$. This causes the transistor P1' to turn off faster thereby enabling the transistor N1' to discharge the node OUT more completely and more quickly.

Invariably, the voltage level of the node OUT falls sufficiently low such that the voltage level outputted from the inverter I3 exceeds a "trip" level of the level detecting inverter I5. When the voltage level outputted from the inverter I3 rises above the trip level, the level detecting inverter I5 changes its output to the low voltage $V_{SS}$. At such time, the NAND gate I7 receives a logic '1' input (from the inverter I3) and a logic '1' input (from the level detecting inverter I5) thereby causing the NAND gate I7 to transition its output to the large high voltage level $V_{DD}$. This completely shuts off the transistor P4' so that only the transistor P2' drives the node OUT' to the large high voltage level $V_{DD}$. The net effect is that the enable circuitry 160 enables the transistor P4' to drive the node OUT' at its maximum drive capacity, but only for a certain period of time. Nevertheless, the drive provided by the large transistor P4' substantially reduces the time required for the node OUT' to rise to the large high voltage level $V_{DD}$.

Note that the transistor P3' is only enabled when the input signal transitions from the low voltage level $V_{SS}$ to the small high voltage level $V_{CC}$. As such, the transistor P3' does not interfere with the discharge of the node OUT by the transistor N1'. Likewise, the transistor P4' is only enabled when the input signal transitions from the small high voltage level $V_{CC}$ to the low voltage level $V_{SS}$. Again, this ensures that the transistor P4' does not interfere with the discharge of the node OUT' by the transistor N4'. As a result, the transistors P3' and P4' can be relatively large, with small "on-impedances" while still enabling proper switching of the level shifting inverter 100.

Note also, that when the transistor P3' or P4' is enabled by the enable circuitry 160, the transistor P3' or P4' is enabled with a low voltage level $V_{SS}$ (i.e., ground). As such, when enabled, the transistor P3' or P4' charges/drives its respective attached node OUT or OUT' with the maximum charge/drive capacity of the transistor P3' or P4'. The low voltage level $V_{SS}$ is applied almost instantly to the gate of the transistor P3' or P4', when enabled, and is maintained at this constant, maximum drive enabling level throughout the entire period during which the transistor P3' or P4' is enabled. The net result is that the rise time is markedly reduced.

Figure 1:
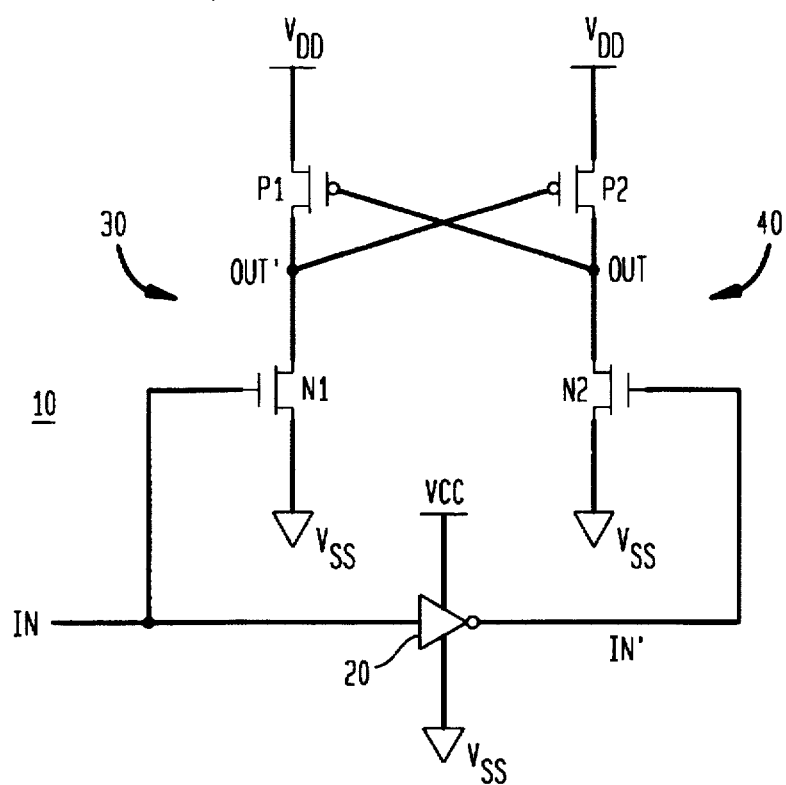
FIG. 1 shows a first conventional level shifter.
Figure 2:
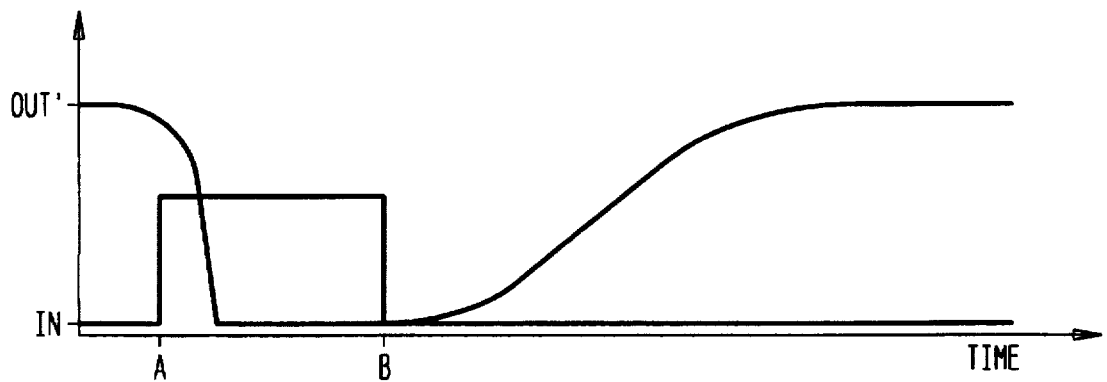
FIG. 2 plots a transient response of the first conventional level shifter of FIG. 1.
Figure 3:
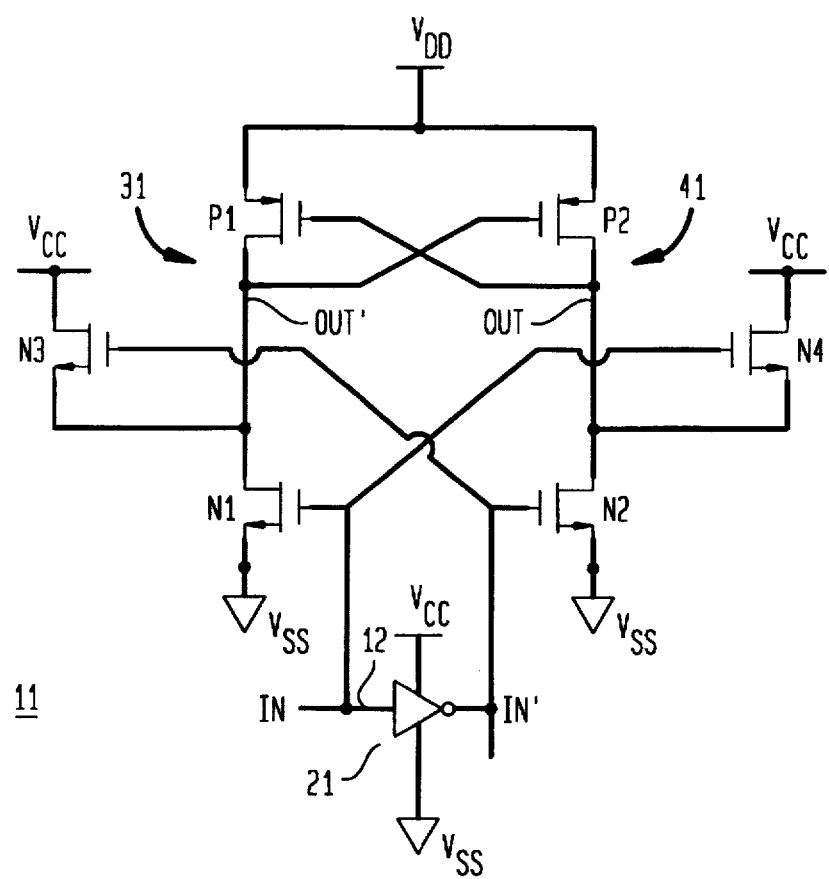
FIG. 3 shows a second conventional level shifter.
Figure 4:
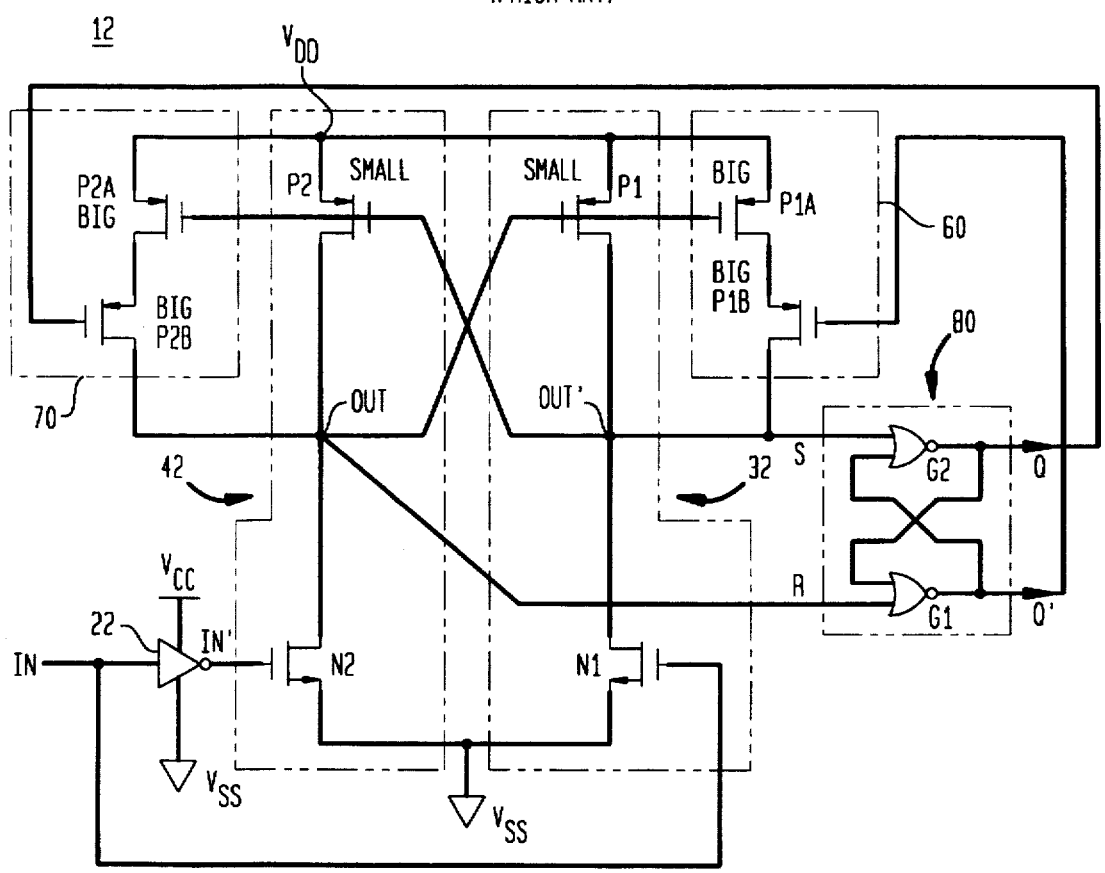
FIG. 4 shows a third conventional level shifter with transient driver circuitry.
Figure 6:
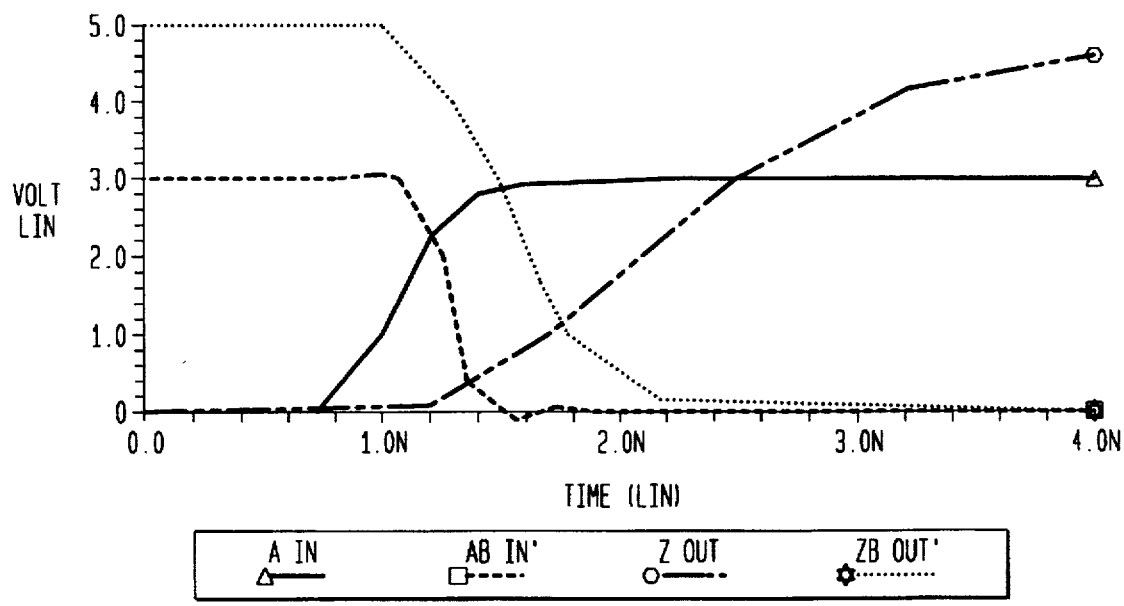
FIGS. 6–7 plot the simulated transient response of the conventional level shifter of FIG. 1.
Figure 7:
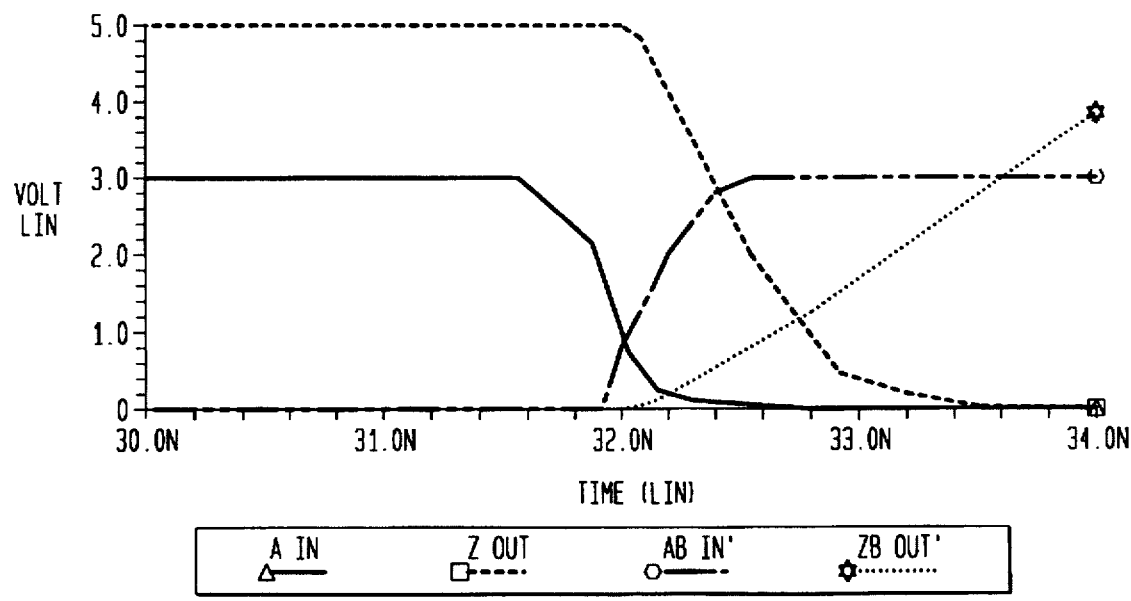

FIGS. 6–7 plot simulated transient responses of the level shifter 10 of FIG. 1. FIGS. 8–9 plot simulated transient responses of the level shifter 100 of FIG. 5. In each simulation, a load of 0.3 pF is assumed to be driven at OUT and OUT'. Compare the high-to-low propagation delays $t_{phl}$ and the low-to-high propagation delays $t_{plh}$. The high-to-low propagation delay $t_{phl}$ is defined as the time period between the time at which the voltage level of the node IN (or IN') falls to $V_{CC}/2$ and the voltage level of the corresponding node OUT (or OUT') falls to $V_{DD}/2$. Likewise, the low-to-high propagation delay $t_{plh}$ is defined as the time period between the time at which the voltage level of the node IN (or IN') rises to $V_{CC}/2$ and the time at which the voltage level of the corresponding node OUT (or OUT') rises to $V_{DD}/2$. As shown in FIGS. 6,7, the propagation delay time between the time at which the voltage of the node IN rises to $V_{CC}/2$ and the time at which the voltage at the node out rises to $V_{DD}/2$ is $t_{plh}$=3.9968 nsec for the conventional level shifter 10 of FIG. 1. The propagation delay time between the time at which the voltage of the node IN falls to $V_{CC}/2$ and the time at which the voltage at the node OUT falls to $V_{DD}/2$ is $t_{phl}$=1.1526 nsec. In FIGS. 8 and 9, the propagation delay time between the time at which the voltage of the node IN rises to $V_{22}/2$ and the time at which the voltage at the node OUT rises to $V_{DD}/2$ is $t_{plh}$=1.9170 nsec for the inventive level shifter 100 of FIG. 5. The propagation delay time between the time at which the voltage of the node IN falls to $V_{CC}/2$ and the time at which the voltage at the node OUT falls to $V_{DD}/2$ is $t_{phl}$=1.0153 nsec. For sake of comparison, the propagation delay times of the node OUT in the level shifter 100, using only the steady-state drivers 130 and 140, is $t_{plh}$=2.8690 nsec and $t_{phl}$=0.97039 nsec. Likewise, the propagation delay times of the node OUT of the level shifter 100, using only the transient driver 150, is $t_{plh}$=2.4804 nsec and $t_{phl}$=1.2067 nsec.

Figure 10:
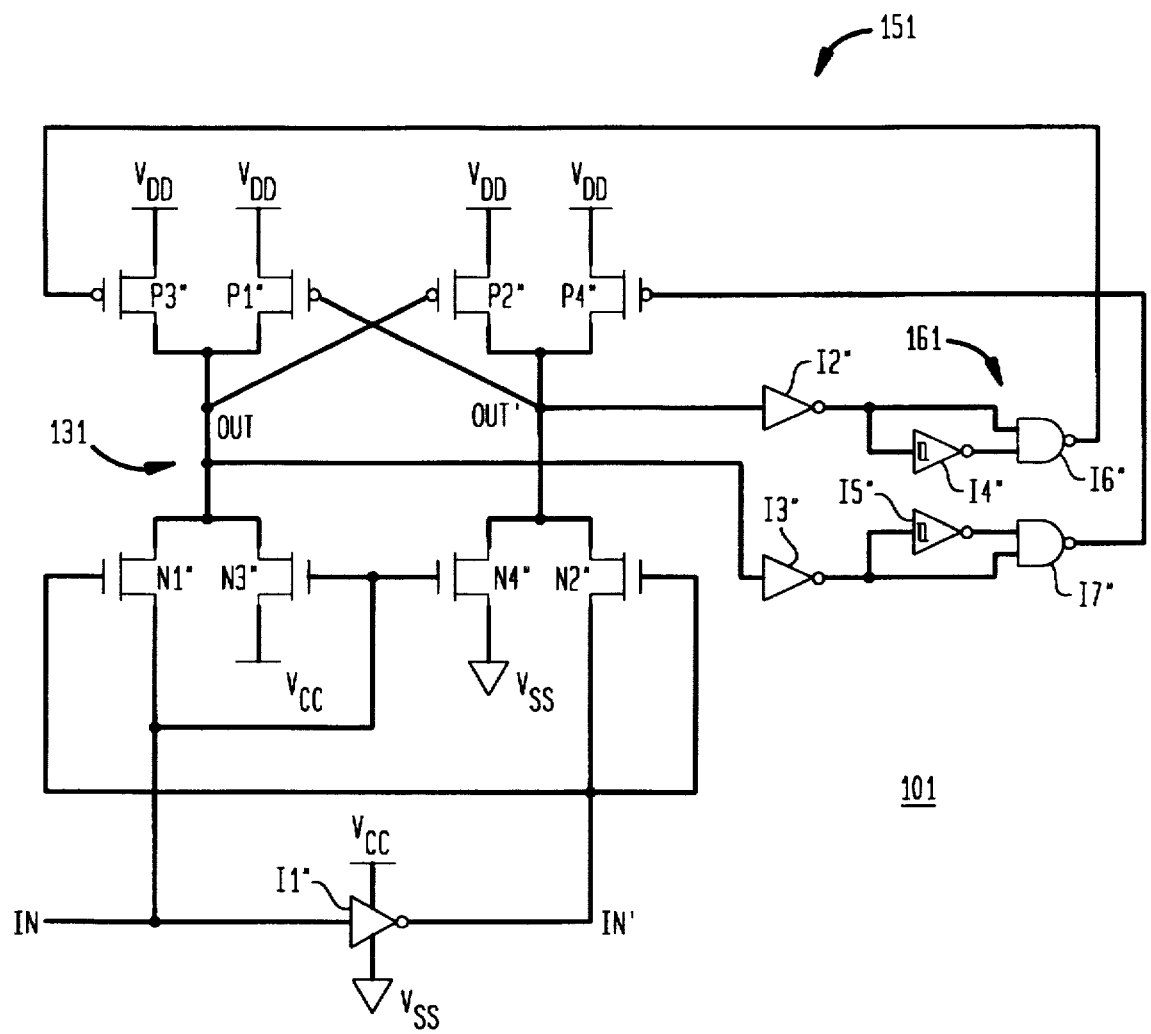
FIG. 10 shows a level shifter according to a second embodiment of the present invention.

FIG. 10 shows a level shifter 101 according to a second embodiment of the present invention. The level shifter 101 has a first steady-state driver 131, a second steady-state driver 141, an inverter I1 and transient driver circuitry 151 with an enable circuit 161. The enable circuit 161 is identical to the enable circuit 160 and includes, inverters I2" and I3", level detecting inverters I4" and I5" and NAND gates I6" and I7". The driver circuitry 151 is identical to the driver circuitry 150 (FIG. 5) and includes PMOS transistors P3" and P4". The steady-state driver 131 includes PMOS transistor P1" and NMOS transistors N1" and N3". The transistor P1" has a source connected to the $V_{DD}$ power supply bus, a drain connected to the node OUT and a gate connected to the node OUT'. The transistors N1" has a drain connected to the node OUT, a gate connected to the node IN' and a source connected to the node IN. The transistor N3" has a drain connected to the node OUT, a gate connected to the node IN and a source connected to the $V_{CC}$ power supply bus. The steady-state driver 141 includes PMOS transistor P2" and NMOS transistors N4" and N2". The transistor P2" has a source connected to the $V_{DD}$ power supply bus, a drain connected to the node OUT' and a gate connected to the node OUT. The transistor N2" has a drain connected to the node OUT', a source connected to the node IN' and a gate connected to the node IN'. The transistor N4" has a drain connected to the node OUT', a source connected to the $V_{SS}$ power supply bus and a gate connected to the node IN.

The level shifter 101 operates in a similar fashion to the level shifter 100. In particular, the transient driver circuitry 151 operates in a similar fashion to the transient driver circuitry 150 (FIG. 5). Only the differences between the operation of the drivers 131, 141 and the drivers 130 and 140 (FIG. 5) are described.

When the voltage level applied to IN is $V_{SS}$, the voltage applied to IN' is $V_{CC}$. In such a case, the transistors N4" and N3" are off and the transistors N1" and N2" are on. The transistor N1" drives the node OUT to the voltage of the node IN ($V_{SS}$). This causes the transistor P2" to be on and drive the node OUT' to $V_{DD}$. The voltage $V_{DD}$ of the node OUT' is received at the transistor P1" which is therefore off. Although the transistor N2" is on, the voltages at its drain, gate and source are $V_{DD}$, $V_{CC}$ and $V_{CC}$, respectively. Therefore, the transistor N2" does not conduct or drive the node OUT'.

17

When the voltage level applied to IN is $V_{CC}$, the voltage applied to IN is $V_{SS}$. In such a case, the transistors N1" and N2" are off and the transistors N3" and N4" are on. The transistor N4" drives the node OUT' to $V_{SS}$. This causes transistor P1" to be on and drive the node OUT to $V_{DD}$, thereby keeping the transistor P2" off. Although the transistor N3" is on, the voltages received at its drain, source and gate are $V_{DD}$, $V_{CC}$ and $V_{CC}$, respectively. Therefore, the transistor N3" does not conduct or drive the node OUT.

When the voltage level applied to the node IN transitions from $V_{SS}$ to $V_{CC}$, the transistors N1" and N2" turn off and the transistors N3" and N4" turn on. As before, the transistor N4" begins to discharge and drive the node OUT' to $V_{SS}$. The node OUT is initially at a low voltage near $V_{SS}$ and rises more slowly than the voltage of the node IN. Therefore, the transistor N3" charges up the node OUT until the voltage of the node OUT reaches $V_{CC}-V_T$ where $V_T$ is the threshold voltage of the transistor N3". The transistor N3" then ceases to conduct or drive the node OUT.

When the voltage level applied to the node IN transitions from $V_{CC}$ to $V_{SS}$, the transistors N3" and N4" turn off and the transistors N1" and N2" turn on. As before, the transistor N1" begins to discharge and drive the node OUT to the voltage level of the node IN ($V_{SS}$). The node OUT' is initially at a low voltage near $V_{SS}$ and rises more slowly than the voltage of the node IN'. Therefore, the transistor N2" charges up the node OUT' until the voltage of the node OUT' reaches $V_{CC}-V_T$ where $V_T$ is the threshold voltage of the transistor N2". The transistor N2" then ceases to conduct or drive the node OUT'.

Figure 11:
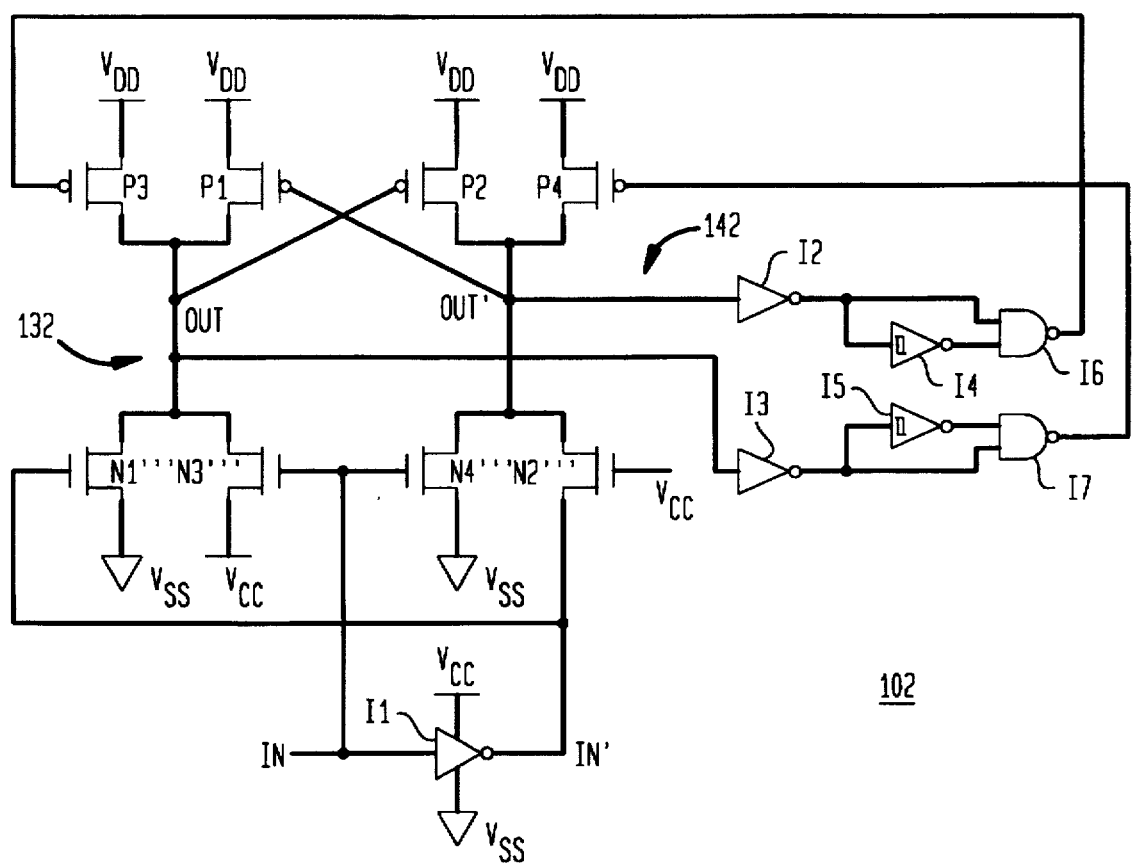
FIG. 11 shows a level shifter according to a third embodiment of the present invention.
Figure 12:
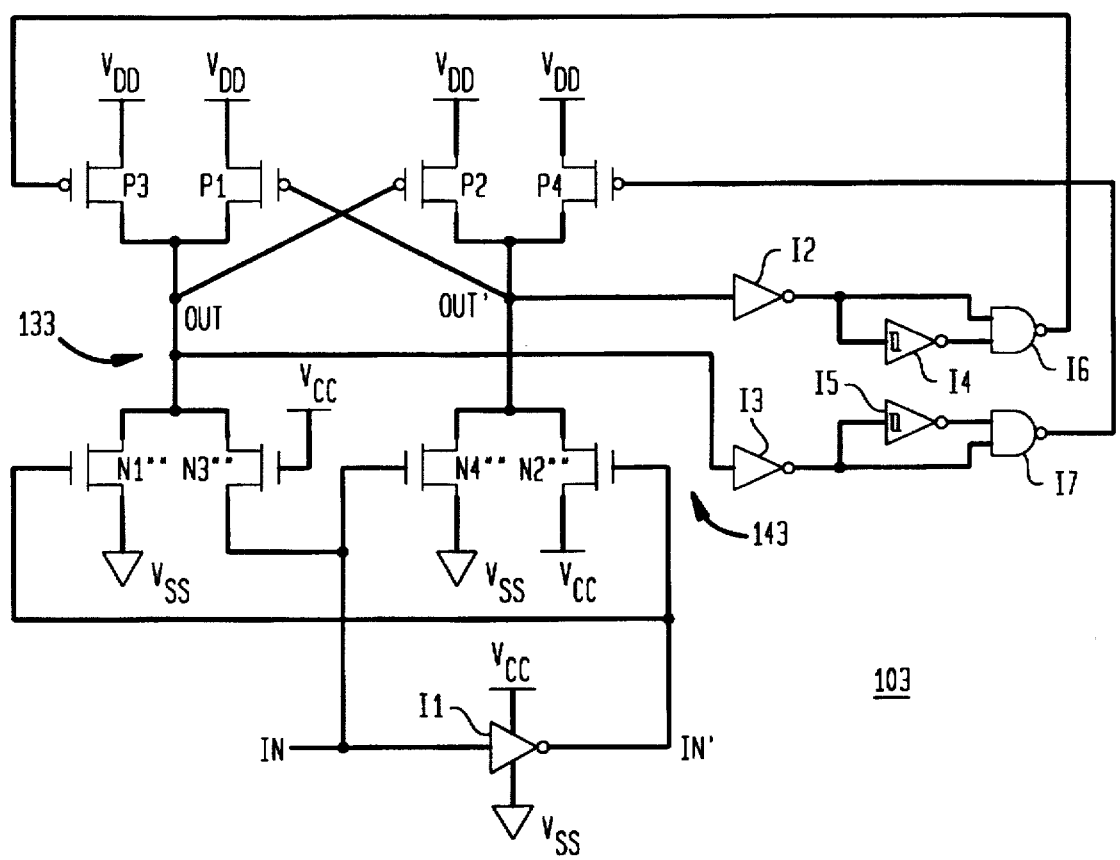
FIG. 12 shows a level shifter according to a fourth embodiment of the present invention.

Other embodiments of the level shifter 102, 103 are shown in FIGS. 11 and 12 which are very similar in operation to the level shifter 100 of FIG. 5. In the level shifter 102 of FIG. 11, the driver 132 has two NMOS transistors N1'" and N3'". The transistor N1'" has a drain connected to the node OUT, a gate connected to the node IN' and a source connected to the $V_{SS}$ power supply bus. The transistor N1'" therefore drives the node OUT to $V_{SS}$ when the input signal is $V_{SS}$. The transistor N3'" has a drain connected to the node OUT, a gate connected to the node IN and a source connected to the $V_{CC}$ power supply bus. The transistor N3'" therefore assists in driving the node OUT up to $V_{CC}-V_T$ when the input signal transitions from $V_{SS}$ to $V_{CC}$. The driver 142 has two NMOS transistors N2'" and N4'". The transistor N4'" has a drain connected to the node OUT', a gate connected to the node IN and a source connected to the $V_{SS}$ power supply bus. The transistor N4'" therefore drives the node OUT' to $V_{SS}$ when the input signal is $V_{CC}$. The transistor N2'" has a drain connected to the node OUT', a gate connected to the $V_{CC}$ power supply bus and a source connected to the node IN'. The transistor N2'" therefore assist in driving the node OUT' from $V_{SS}$ to $V_{CC}-V_T$ when the input signal transitions from $V_{CC}$ to $V_{SS}$.

In the level shifter 103, the driver 133 has two NMOS transistors N1"" and N3"". The transistor N1"" is connected similarly as the transistor N1'" (FIG. 11) and the transistor N3"" is connected similarly as the transistor N2'" (FIG. 11), except that the source of the transistor N3"" is connected to the node IN. The transistor N1"" drives the node OUT to $V_{SS}$ when the input signal is $V_{SS}$. The transistor N3"" assists in driving the node OUT to $V_{CC}-V_T$ when the input signal transitions from $V_{SS}$ to $V_{CC}$. The driver 143 also has two NMOS transistors N4"" and N2'". The transistor N4"" is connected similarly as the transistor N4'" (FIG. 11). The transistor N2"" is connected similarly as the transistor N3'" (FIG. 11) except that the gate of the transistor N2"" is connected to the node IN'. The transistor N4"" drives the

18 node OUT' to $V_{SS}$ when the input signal is $V_{CC}$. The transistor N2"" assists in driving the node OUT' to $V_{CC}-V_T$ when the input signal transitions from $V_{CC}$ to $V_{SS}$.

In short, a level shifter is provided with first and second steady-state drivers and transient driver circuitry. Each steady-state driver includes a low enable input, a high enable input and an output. Each steady-state driver outputs from its respective output a low voltage level signal when an enabling voltage level is received at its low enable input and a disabling voltage is received at its high enable input. Furthermore, each steady-state driver outputs from its output a first high voltage level signal, that is higher than a second high voltage level of an input signal, when a disabling voltage level is received at its low enable input and an enabling high voltage level is received at its high enabling input. The high enable input of the first steady-state driver is connected to the output of the second steady-state driver. The high enable input of the second steady-state driver is connected to the output of the first steady-state driver. The input of the first steady-state driver receives a complement of the input signal and the input of the second steady-state driver receives the input signal. The transient driver circuitry responds to a transition in the voltage level of the input signal by driving the output of one of the first and second drivers, to the first high voltage level, for a certain time period. The transient driver circuitry is enabled to drive the output with a maximum driving capacity throughout the aforementioned certain time period.

Finally, the above-discussion is intended to be merely illustrative of the invention. Numerous alternative embodiments may be devised by those having ordinary skill in the art without departing from the spirit and scope of the following claims.

The claimed invention is:

1. A level shifter comprising:
   first and second steady-state drivers, each comprising a low enable input, a high enable input and an output which outputs a low voltage level signal when an enabling voltage level is received at said low enable input and a disabling voltage is received at said high enable input, and which outputs a first high voltage level signal, that is higher than a second high voltage level of an input signal, when a disabling voltage level is received at said low enable input and an enabling high voltage level is received at said high enable input, said high enable input of said first driver being connected to said output of said second driver, said high enable input of said second driver being connected to said output of said first driver, said input of said first driver receiving a complement of said input signal and said input of said second driver receiving said input signal, and transient driver circuitry, which responds to a transition in input signal voltage level by driving said output of one of said first and second drivers to said first high voltage level, for a certain time period, said transient driver circuitry being enabled to drive said output with a maximum driving capacity throughout said certain time period, said transient driver circuitry including enabling circuitry which comprises:
   a first voltage level detector, receiving said output of said first driver and generating a first value indicating that said voltage level of said output of said first driver is below a trip level of said first voltage level detector,
   a second voltage level detector, receiving said output of said second driver and generating a second value indicating that said voltage level of said output of said second driver is below a trip level of said second voltage level detector, and at least one logic circuit, receiving said voltage level of said outputs of said first and second drivers and said first and second values from said first and second voltage level detectors, and enabling said transient driver circuitry to drive said output of said first driver if said voltage level of said output of said second driver is falling and so long as said second value is received, and enabling said transient driver circuitry to drive said output of said second driver if said voltage level of said output of said first driver is falling and so long as said first value is received.

2. The level shifter of claim 1 wherein said transient driver circuitry detects that a transition has occurred in said input signal voltage level from said signals outputted from said outputs of said first and second drivers.

3. The level shifter of claim 1 wherein said transient driver circuitry comprises level detection circuitry which monitors a voltage level of said outputs of said first and second drivers, said level detection circuitry enabling said driving of said output of said first driver in response to detecting a drop in voltage level at said output of said second driver and enabling said driving of said output of said second driver in response to detecting a drop in voltage level at said output of said first driver.

4. The level shifter of claim 1 wherein said transient driver circuitry drives said output from said low voltage level to said second high voltage level in response to said input signal transition.

5. The level shifter of claim 1 wherein said transient driver circuitry comprises:

a first PMOS transistor, having a gate, a source receiving said second high voltage level, and a drain connected to an output of said first driver, and a second PMOS transistor, having a gate, a source receiving said second high voltage level, and a drain connected to an output of said second driver, wherein said enabling circuitry receives said voltages outputted from said first and second drivers and outputs, for said certain period of time, an enabling voltage that enables maximum capacity drive, to said gate of said first PMOS transistor, in response to detecting said input signal transitioning from said first high voltage level to said low voltage level, and to said gate of said second PMOS transistor, in response to detecting said input signal transitioning from said low voltage level to said first high voltage level.

6. The level shifter of claim 1 wherein said transient driver circuitry speeds up a time required for said output of said first driver to rise from said low voltage level to said second high voltage level, when said input signal transitions from said first high voltage level to said low voltage level, and speeds up a time required for said output of said second driver to rise from said low voltage level to said second high voltage level, when said input signal transitions from said low voltage level to said first high voltage level.

7. The level shifter of claim 1 wherein each of said first and second drivers comprises:

at least one NMOS transistor, having a drain connected to said corresponding output, a source and a gate, wherein at least one of said source and said gate is connected to said corresponding low enable input and a PMOS transistor, having a gate connected to said corresponding high enable input, a source receiving said second high voltage level and a drain connected to said corresponding output.

8. An integrated circuit with a level shifter comprising:

first and second steady-state drivers, each comprising a low enable input, a high enable input and an output which outputs a low voltage level signal when an enabling voltage level is received at said low enable input and a disabling voltage is received at said high enable input, and which outputs a first high voltage level signal, that is higher than a second high voltage level of an input signal, when a disabling voltage level is received at said low enable input and an enabling high voltage level is received at said high enable input, said high enable input of said first driver being connected to said output of said second driver, said high enable input of said second driver being connected to said output of said first driver, said input of said first driver receiving a complement of said input signal and said input of said second driver receiving said input signal, and transient driver circuitry, which responds to a transition in input signal voltage level by driving said output of one of said first and second drivers, for a certain time period, said transient driver circuitry being enabled to drive said output with a maximum driving capacity throughout said certain time period, said transient driver circuitry including enabling circuitry which comprises:

a first voltage level detector, receiving said output of said first driver and generating a first value indicating that said voltage level of said output of said first driver is below a trip level of said first voltage level detector, a second voltage level detector, receiving said output of said second driver and generating a second value indicating that said voltage level of said output of said second driver is below a trip level of said second voltage level detector, and at least one logic circuit, receiving said voltage level of said outputs of said first and second drivers and said first and second values from said first and second voltage level detectors, and enabling said transient driver circuitry to drive said output of said first driver if said voltage level of said output of said second driver is falling and so long as said second value is received, and enabling said transient driver circuitry to drive said output of said second driver if said voltage level of said output of said first driver is falling and so long as said first value is received.

\* \* \* \* \*